(12) United States Patent
Yamawaki et al.

(10) Patent No.: US 7,411,267 B2
(45) Date of Patent: Aug. 12, 2008

(54) SEMICONDUCTOR INTEGRATED CIRCUIT DEVICE

(75) Inventors: Kentaro Yamawaki, Fukuoka (JP); Yoshihiko Yasu, Kodaira (JP); Yasuto Igarashi, Higashimurayama (JP); Takashi Kuraishi, Chofu (JP); Kazumasa Yanagisawa, Kokubunji (JP)

(73) Assignee: Renesas Technology Corp., Tokyo (JP)

( * ) Notice: Subject to any disclaimer, the term of this patent is extended or adjusted under 35 U.S.C. 154(b) by 732 days.

(21) Appl. No.: 11/048,909

(22) Filed: Feb. 3, 2005

(65) Prior Publication Data
US 2005/0218959 A1 Oct. 6, 2005

(30) Foreign Application Priority Data
Mar. 30, 2004 (JP) .............................. 2004-097428

(51) Int. Cl.
*H01L 29/00* (2006.01)
(52) U.S. Cl. .................................................... 257/499

(58) Field of Classification Search ......... 257/499–503, 257/691, 758, E23.079
See application file for complete search history.

(56) References Cited

U.S. PATENT DOCUMENTS

| | | | |
|---|---|---|---|
| 6,483,165 B2 * | 11/2002 | Ooishi et al. ................. | 257/499 |
| 6,489,850 B2 * | 12/2002 | Heineke et al. ............. | 330/307 |
| 2003/0141926 A1 | 7/2003 | Mizuno et al. | |
| 2004/0058506 A1 * | 3/2004 | Fukuzumi ................... | 438/422 |

FOREIGN PATENT DOCUMENTS

| | | |
|---|---|---|
| JP | 11-008306 | 6/1997 |
| JP | 2003-218682 | 1/2002 |

* cited by examiner

*Primary Examiner*—Nathan W Ha
(74) *Attorney, Agent, or Firm*—Reed Smith LLP; Stanley P. Fisher, Esq.; Juan Carlos A. Marquez, Esq.

(57) ABSTRACT

The invention provides a semiconductor integrated circuit device with improved designing efficiency while achieving higher functions. An inner circuit is surrounded by a plurality of cells in which a first switch element for connecting a power supply voltage line or a ground voltage supply line to a power supply line of an internal circuit is disposed below power supply lines extending in a first and second directions, and the power lines are connected together.

7 Claims, 14 Drawing Sheets

SEMICONDUCTOR INTEGRATED CIRCUIT DEVICE

BACKGROUND OF THE INVENTION

The present invention relates to a semiconductor integrated circuit device and, more particularly, to a effective technique when used for a system LSI (large scale integrated circuit) or the like which is divided into circuit blocks for a plurality of function modules and supplies a power supply voltage to each of the circuit blocks.

By a publicly-known-technique search performed after the present invention has been made, the existence of Japanese Unexamined Patent Publication No. 2003-218682 in which a plurality of function modules are assembled in a semiconductor integrated circuit and Japanese Unexamined Patent Publication No. Hei 11(1999)-008306 in which an annular-shaped power source is connected by macro cells was reported. The patent documents, however, do not describe anything regarding the technical problems to be solved by the present invention to be described later.

SUMMARY OF THE INVENTION

A CMOS circuit obtained by combining a P-channel MOSFET and an N-channel MOSFET has a characteristic such that, when an input signal does not change, one of the MOSFETs is turned off, direct current does not flow theoretically, and power consumption is low. However, as microfabrication of devices develops, the leak current flowing in the MOSFET in the off state is becoming unignorable. In particular, in a large scale integrated circuit, an enormous number of devices are formed, so that a large leak current flows in the semiconductor integrated circuit device as a whole.

Therefore, the device is divided into blocks in correspondence with function modules in an LSI and a power supply method adapted to each of the functions is examined. For a circuit such as a ROM in which no influence is exerted on a circuit operation by turn-off of the power and re-turn-on of the power, as described in Japanese Unexamined Patent Publication No. 2003-218682, by interrupting the power supply voltage in a standby mode, the leak current is prevented and low power consumption is achieved. On the other hand, in a device having a storing circuit such as a register, to hold information stored in the register and the like also in the standby mode in which no operation is performed, the power supply voltage cannot be interrupted. Therefore, a method of supplying a bias voltage to a back gate of an MOSFET to increase an effective threshold voltage and, while largely reducing the leak current, maintaining the on/off state of the MOSFET has been considered.

Also in a circuit such as a ROM where there is no problem in the circuit operation even if the power supply is interrupted but it is necessary to shorten the startup time since power turn-on till an operable state is obtained, it is convenient to provide a standby mode in which the power supply voltage is interrupted and a standby mode in which a bias voltage is supplied to the back gate to set a half-operating state. The inventors herein have also noticed that, in the mode of supplying the back bias, to conduct a direct current test at high precision, it is effective to reduce the leak current. In the case of constructing a plurality of function modules of different power supply specifications in the semiconductor integrated circuit device, it is necessary to design and perform layout of a power supply circuit for each of the function modules. The number of designing works increases, accompanying the increase, human mistakes increase, and designing efficiency deteriorates. In addition, power supply wiring in the case where a copper wiring layer is used for a semiconductor integrated circuit has been also examined.

An object of the invention is to provide a semiconductor integrated circuit device having improved design efficiency while achieving higher functions. The above and other objects and novel features of the invention will become apparent from the description of the specification and the appended drawings.

An outline of a representative one of inventions disclosed in the specification will be briefly described as follows. An inner circuit is surrounded by: a first cell in which a first switch element for connecting a power supply voltage line or an ground voltage supply line to a power supply line of an internal circuit is disposed below a first pair of power supply lines constructed by a power supply voltage line and an ground voltage supply line of the circuit which extend in parallel in a first direction; a second cell in which a second switch element and a third switch element are disposed below second pair of power supply lines extending in parallel in a second direction orthogonal to the first direction, the second switch element for connecting a first bias line connected to a first well region and a first back bias line, and the third switch element for connecting a second bias line connected to a second well region of the inner circuit and a second back bias line; and a third cell in which a plurality of kinds of elements are distributed, including a power supply switch controller for controlling the first switch element of the first cell below corner power supply lines for a corner of a device area in which the inner circuit is to be formed and for connecting the first and second pair of power supply lines, fourth and fifth switch elements for connecting the corresponding power supply voltage line and the ground voltage supply line of the circuit to the first and second bias lines, and a control circuit for controlling switch between the fourth and fifth switch elements and the second and third switch elements. Moreover, a plurality of cells are provided so that corresponding power supply lines are connected to each other.

While maintaining an operation at the back gate with lower power consumption due to interruption of the power supply, the power supply circuit can be shared by internal circuits requested to restart in short time with lower power consumption, and the power supply circuit can be also applied to a high-precision direct current test in a functional block.

DETAILED DESCRIPTION OF THE PREFERRED EMBODIMENTS

Figure 1:
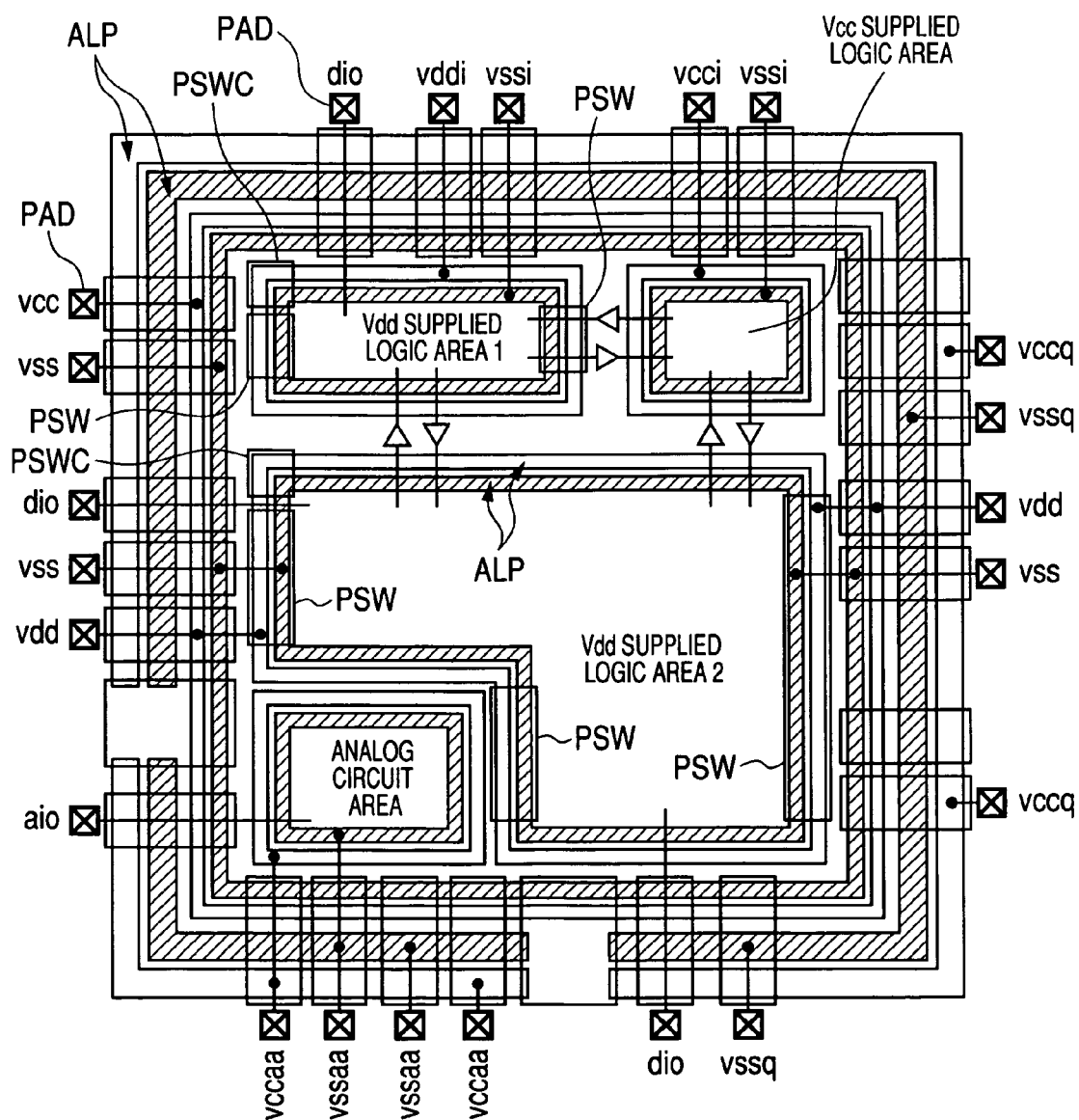
FIG. 1 is a schematic layout diagram showing an embodiment of a semiconductor integrated circuit device according to the invention.

FIG. 1 is a schematic layout diagram showing an embodiment of a semiconductor integrated circuit device according to the invention. The diagram shows the layout mainly illustrating power supply lines formed in the semiconductor integrated circuit device according to the invention. The power supply line is constructed by a set of a power supply voltage line and a ground voltage supply line of the circuit. By hatching the ground voltage supply line, the wiring layout is illustrated so that the lines can be easily distinguished from each other.

The semiconductor integrated circuit device of the embodiment is operated by two kinds of power supply voltages vcc and vdd. Although not limited, a relatively high power supply voltage such as 3.3V is used as the power supply voltage vcc, and a low voltage such as 1.2V is used as the power supply voltage vdd. As the relatively high power supply voltage vcc, a power supply voltage vccaa for analog logic, a power supply voltage vccq for an input/output circuit, and a power supply voltage vcci for an internal circuit are provided. Earth potentials vssaa, vssq, and vssi of the circuit are provided in correspondence with the power supply voltages vccaa, vccq, and vcci, respectively. A power supply line indicated by a thick line around the periphery of a semiconductor chip is divided into two parts; one part for an analog circuit, and the other part for a digital circuit. The power supply voltages vccaa and vccq are provided on the outer side and the ground voltage supply lines vssaa and vssq of the circuit are disposed on the inner side. As internal circuits having specific circuit functions as vcc supplied circuits, there are a vcc supplied logic circuit and a vcc supplied analog logic circuit around each of which a power supply line indicated as a thin line are provided. The power supply line surrounding the vcc supplied logic circuit is connected to power supply pads vcci and vssi. The power supply line surrounding the analog logic circuit is connected to the thick power supply line and also to the power supply pads (PAD) vccaa and vssaa.

As the power supply lines vdd and vss, the lines indicated by annular thin lines along the inside of the power supply line indicated by the thick line and lines corresponding to internal circuits which will be described later are provided. The annular vdd power supply line is used for an operation voltage of a level shifting circuit for converting a vdd internal signal to a signal having a large amplitude such as the vcc power supply voltage in an input/output interface, and an operation voltage of a micro io circuit for transmitting/receiving signals to/from vdd internal circuits which always operate such as a vdd supplied logic circuit 1, a vdd supplied logic circuit 2, and a vcc supplied logic circuit. As internal circuits operating on the vdd power supply voltage, the vdd supplied logic circuit 1 and the vdd supplied logic circuit 2 are provided. A power supply line indicated by a thin wiring line is provided so as to surround the circuit blocks. The vdd supplied logic circuit 2 is provided with independent power supply pads (PAD) such as vddi and vssi for noise separation from the vdd supplied logic circuit 1 and the internal circuits operating on the annular power supply line.

In correspondence with the power supply lines, a plurality of sets of power supply pads (PAD) vcc and vss, a plurality of sets of power supply pads (PAD) vdd and vss, a plurality of sets of power supply pads (PAD) vccq and vssq, and a plurality of sets of power supply pads (PAD) vccaa and vssaa are provided as necessary. The other pads (PAD) illustratively shown as representatives include a pad "aio" for inputting/outputting an analog signal and a vdd power supply pad "dio" for inputting/outputting a digital signal, and inputs/outputs signals directly from/to the vdd supplied logic circuit 1 and the vdd supplied logic circuit 2. Pads for inputting/outputting a vcc power supply voltage are not shown in FIG. 1. Quadrangle blocks shown in correspondence with the pads construct an input/output interface circuit. As pads for inputting/outputting signals corresponding to an input/output interface, representative pads such as dio and aio are illustrated. In particular, a number of input/output pads for digital signals are provided so as to surround the periphery of a semiconductor chip together with the power supply pads.

In the embodiment, a function of setting the inner circuit blocks of the vdd supplied logic circuit 1 and the vdd supplied logic circuit 2 into a lower power consumption mode when no operation is performed even at the time of turn-on of the power supply is provided. A power switch PSW is provided below each of the power supply lines formed so as to surround the internal circuits to realize the low consumption power mode, and a power switch control circuit PSWC is disposed below the power supply line at the corner of the power supply line. As will be described later, each of the power supply main lines (vcc and vss, vdd and vss, vccq and vssq, and vccaa and vssaa) formed so as to surround the corresponding circuits for the purpose of, for example, decreasing the impedance of the power supply line is formed by an aluminium pad line ALP which is relatively thick and is formed by the same process as that of the bonding pad.

Figure 2:
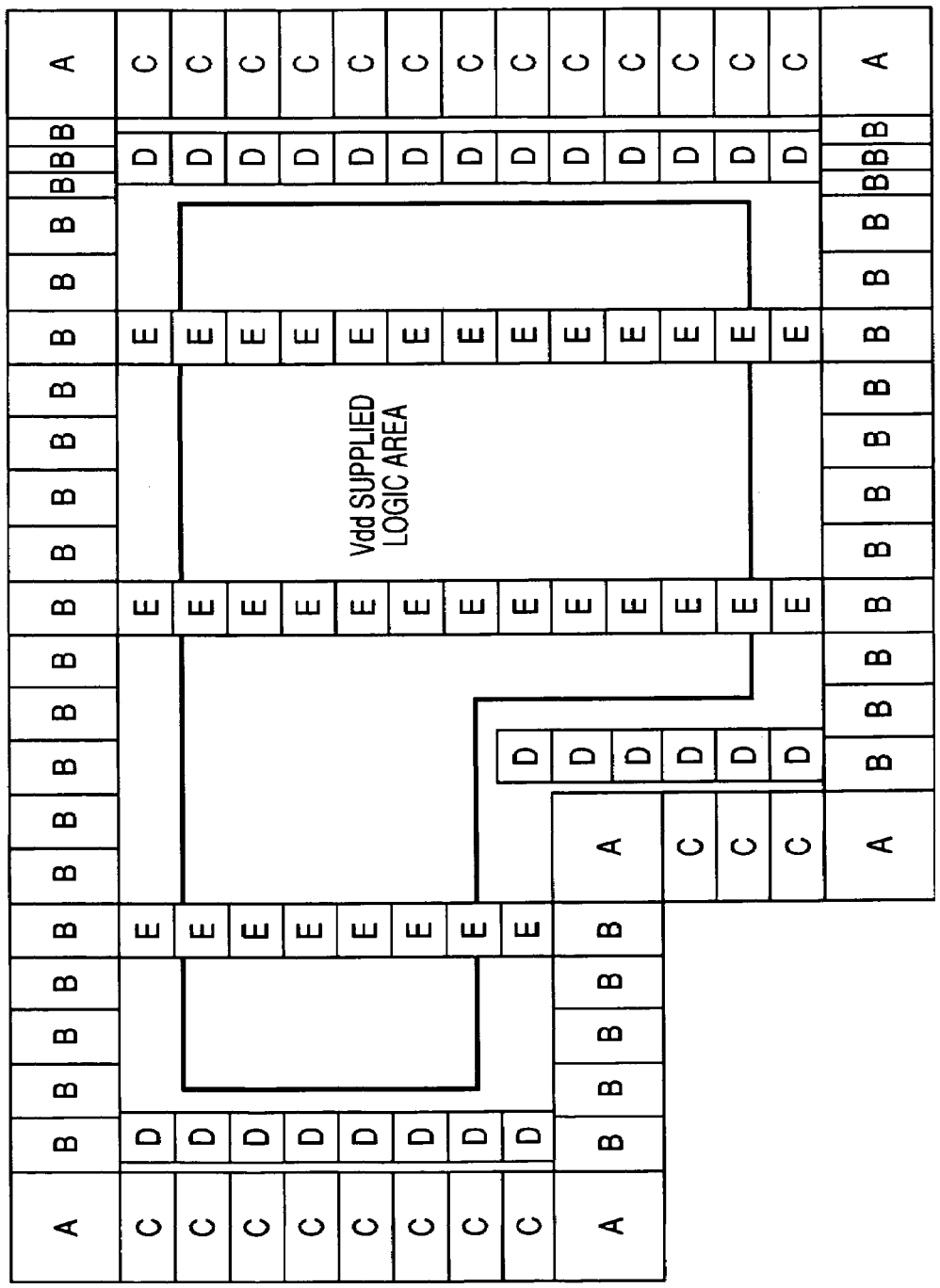
FIG. 2 is a layout diagram showing an example of power supply lines for a vdd supplied logic area 2 in FIG. 1.

FIG. 2 is a layout diagram showing an example of the power supply lines corresponding to the vdd supplied logic area 2 in FIG. 1. In the example, the power supply line is constructed by cells. The kinds of cells are not particularly limited but, in this case, broadly, four kinds of cells A, B, C, and D are prepared. According to the directions of the characters A to D in the diagram, the cells C construct power supply lines which are long in the vertical direction. The cells B construct power supply lines which are long in the lateral direction. The cells A construct power supply lines at the corners by which the power supply lines in the vertical and lateral directions are connected. The cells B include, although not limited, a standard cell and a small cell B for adjusting the length.

Cells E construct power supply lines above the vdd supplied logic area 2 so as to extend in the vertical direction and connect the facing cells B. The cells E are used to construct a power supply mesh to be described later. Cells D are internal connection cells, extend laterally from the power supply line extending in the vertical direction, and are used for connection to an internal power supply line of an internal circuit. Below the cells A, B, and C out of the cells A to E, the power switch device and a circuit device as a component of a power switch control circuit are disposed. In contrast, only a power supply line is provided for the cells E. For the cells D, an underlayer wiring line for connection to the internal power supply line is provided.

Figure 3:
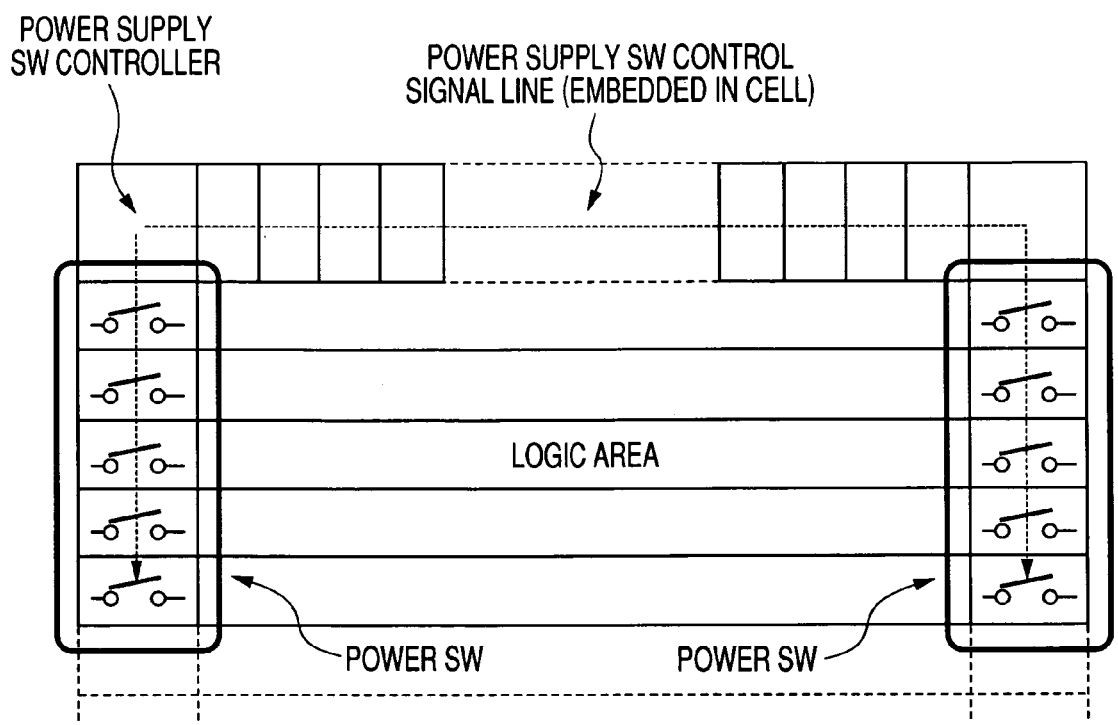
FIG. 3 is a schematic layout diagram showing an example of a part below power supply lines for a vdd supplied logic area 1 in FIG. 1.

FIG. 3 is a schematic layout diagram showing an example of a part below the power supply lines for the vdd supplied logic area 1 in FIG. 1. In the example, the relation between the cells C and the cells A is mainly illustrated. A switch is provided for each of the cells C. Although not limited, one end of the switch is connected to the ground voltage supply line vssi out of the power supply voltages vddi and vssi provided above and the other end is connected to a ground voltage supply line for supplying an earth potential of the circuit to the logic area. Although not limited, in the logic area, as will be described later, a well region in which a P-channel MOSFET and an N-channel MOSFET constructing a CMOS logic circuit such as a gate array are to be formed is formed so as to be long in the lateral direction. The switch is provided along the well region. The ground voltage supply line vss of the internal circuit is disposed in the lateral direction along the P-type well in which the N-channel MOSFET is formed. On the other hand, the power supply line vdd is disposed in the lateral direction along an N-type well region in which the P-channel MOSFET is to be formed. In the diagram, blocks obtained by dividing the internal logic area into columns correspond to a circuit region in which the N-channel MOSFET and the P-channel MOSFET are formed.

The cell A disposed at the left upper corner is provided with a power supply SW controller (power switch control circuit PSWC) for controlling the on/off state of the switches provided for the cells C. A switch control signal generated by the power supply SW controller is transmitted to each of the switches via a power supply SW control signal line indicated by a dotted line in the diagram. In the diagram, the power supply SW control signal line for controlling the power supply SW (switches) provided for the cells C disposed on the left side of the logic area extends to the switches of the cells C by using the wiring regions provided for the cells C.

The power supply SW control signal line for controlling the power supply SW provided for the cells C disposed on the right side of the logic area extends to the switches of the cells C disposed on the right side by using the wiring region provided for each of the cells B disposed in the lateral direction and the wiring region provided for the cells A. The switches are used for controlling the power supply of the internal circuit as described above, so that it is unnecessary to provide such a switch at each of the corners. By disposing the power supply SW controller (power switch control circuit PSWC) as described above, the circuit formation area below the power supply line is effectively utilized.

Figure 4:
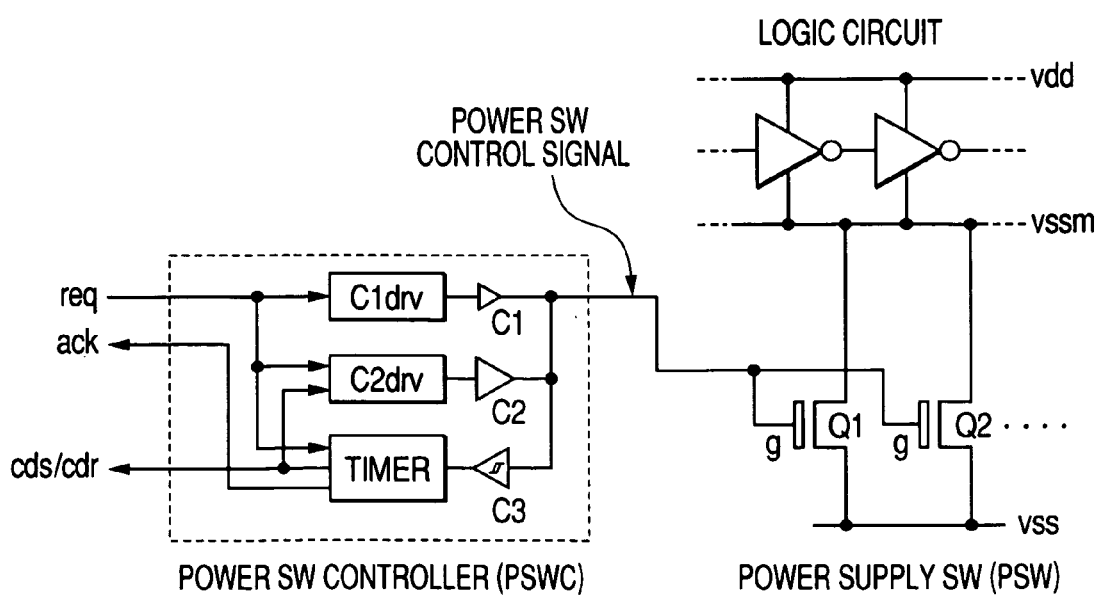
FIG. 4 is a circuit diagram showing an example for explaining the relations among a power supply SW controller (PSWC) in FIG. 3, a power supply SW, and an internal logic.

FIG. 4 is a circuit diagram showing an example for explaining the relations among the power supply SW controller (PSWC), the power supply SW, and the internal logic circuit in FIG. 3. An inverter circuit indicated as a circuit representing the internal logic circuits operates on an operation voltage transmitted via the power supply line vdd and the internal ground voltage supply line vssm. Via the power supply line vdd of the internal logic circuit, a power supply voltage supplied from the external terminal is continuously transmitted via the pads and the wiring path as described above. The internal ground voltage supply line vssm is connected to the ground voltage supply line vss formed so as to surround the internal circuit via N-channel MOSFETs Q1 and Q2 as power supply SW (switches) illustrated as representatives. To the gates "g" of MOSFETs as a plurality of switches provided in correspondence with the cells C, the power supply SW control signal is commonly supplied.

The power supply SW controller (PSWC) generates switch control signals such as the MOSFETs Q1 and Q2 and the like in response to a control signal "req". In the logic area, when the MOSFETs Q1 and Q2 are switched from the off state to the on state at high speed, due to the fact such that an input signal is indeterminate in an inverter circuit, a logic gate circuit, and the like in the logic area, current flows at once. Consequently, a large noise occurs in the power supply voltage vdd and the ground voltage supply potential vss of the circuit and a burden of a large current supply is instantaneously applied on the power supply unit of the system. In the embodiment, by two drive circuits C1drv and C2drv, output circuits C1 and C2 for generating output signals, a determining circuit C3 for determining the level of a power supply SW control signal, and a timer circuit "Timer", a power supply SW control signal for driving the MOSFETs Q1 and Q2 and the like in two levels is generated.

When a power-on operation is instructed by the control signal "req", the drive circuit C1drv increases the gate voltages of the MOSFETs Q1 and Q2 as the power switches via the output circuit C1 in response to the power-on operation. The output circuit C1 is constructed by an MOSFET whose current supply capability is low. When a signal is connected to the gates of the MOSFETs Q1 and Q2 as a number of power switches, the level of the power supply SW control signal line having a large load capacitance gradually increases. When the gate voltage of the MOSFETs Q1, Q2, and the like as power switches becomes equal to or higher than a threshold voltage, the MOSFETs Q1, Q2, and the like are controlled so as to pass relatively small current. Consequently, current generated when an input signal is indeterminate or the like in the inverter circuit, the logic gate circuit, and the like in the logic area is regulated, thereby preventing occurrence of noise in the power supply voltage vdd and the earth potential vss of the circuit and preventing the burden of instantaneous supply of a large current on the power supply system. It is considered that occurrence of the noise exerts an adverse influence on the other logic circuits, interface circuits, analog circuits, and the like which are operating. Consequently, consideration has to be made to the case of providing the function of setting a low power consumption mode by turning off the power supply when no operation is performed on a part of the circuits.

The timer circuit "Timer" operates the output circuit C2 via the drive circuit C2drv when the level of the power supply SW control signal line becomes equal to or higher than a predetermined level by the voltage determining circuit C3 having a hysteresis characteristic. The output circuit 2 is formed by a MOSFET whose current supply capability is high to increase the gates "g" of the MOSFETs Q1, Q2, and the like as a number of power switches to the power supply voltage vdd at high speed. It makes the vdd supplied logic circuit operative. The timer circuit "Timer" outputs a signal "ack" indicating that the operation of the logic circuit is effective to the other circuits with delay time. A signal cds/cdr is a signal for controlling the micro io and is used to regulate a signal output to be transmitted to, for example, the micro io until the logic signal is made valid.

Figure 5:
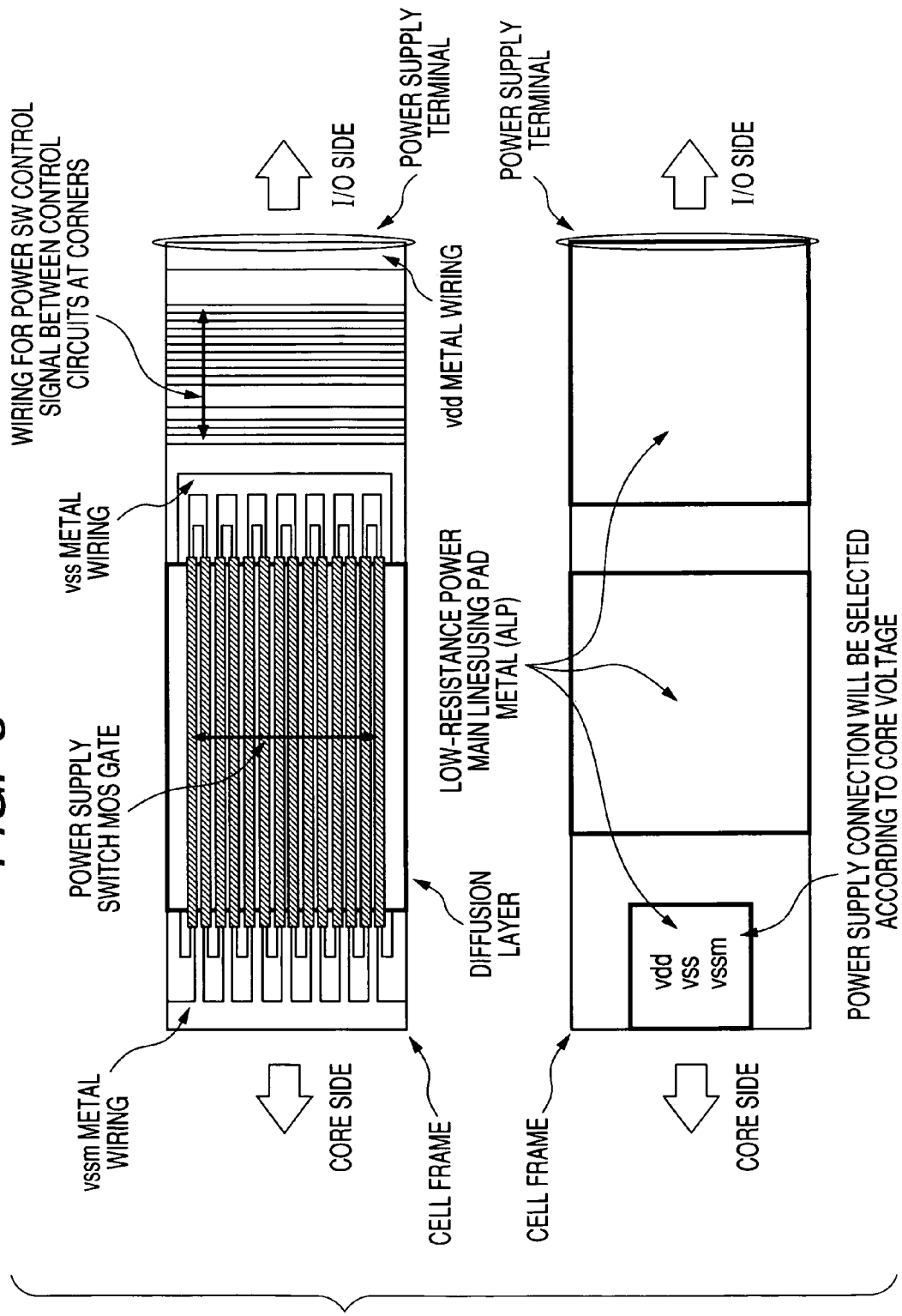
FIG. 5 is a schematic layout diagram showing an example of a cell C in FIG. 2.

FIG. 5 is a schematic layout diagram showing an example of the cell C. In FIG. 5, the power supply lines of the uppermost layer and a device formation part provided below the power supply lines are shown in the upper and lower parts. The lower part of FIG. 5 shows the power supply lines of the uppermost layer and a set of the power supply lines vdd and vss is provided. Although not limited, in the example, the power supply lines vdd and vss are formed by using a relatively thick aluminium layer (ALP) which is formed in the same process as a bonding pad. The core side is the logic area side, and power supply connection is changed according to the potential vdd, vss, or vssm to be connected.

The upper part of FIG. 5 shows the device formation part in which a plurality of gate electrodes extending in the lateral direction are aligned in the vertical direction. A diffusion layer constructing the source and the drain are formed so as to sandwich the gate electrodes. The diffusion layer sandwiched by two neighboring gate electrodes is formed as a source or drain common to MOSFETs having the two gate electrodes. The sources and drains are alternately disposed every other line while sandwiching the gates. On the I/O side (right side), the diffusion layers every other line are shared as a source and connected to the power supply line vss. On the core side, the other diffusion layers are shared as a drain and connected to the vssm metal line as the ground voltage supply line of the logic circuit. On the right side in the cell frame, a plurality of wiring layers extending in the vertical direction are provided and used as a wire between the corner control circuits and a line for transmitting the power supply SW control signal.

Figure 6:
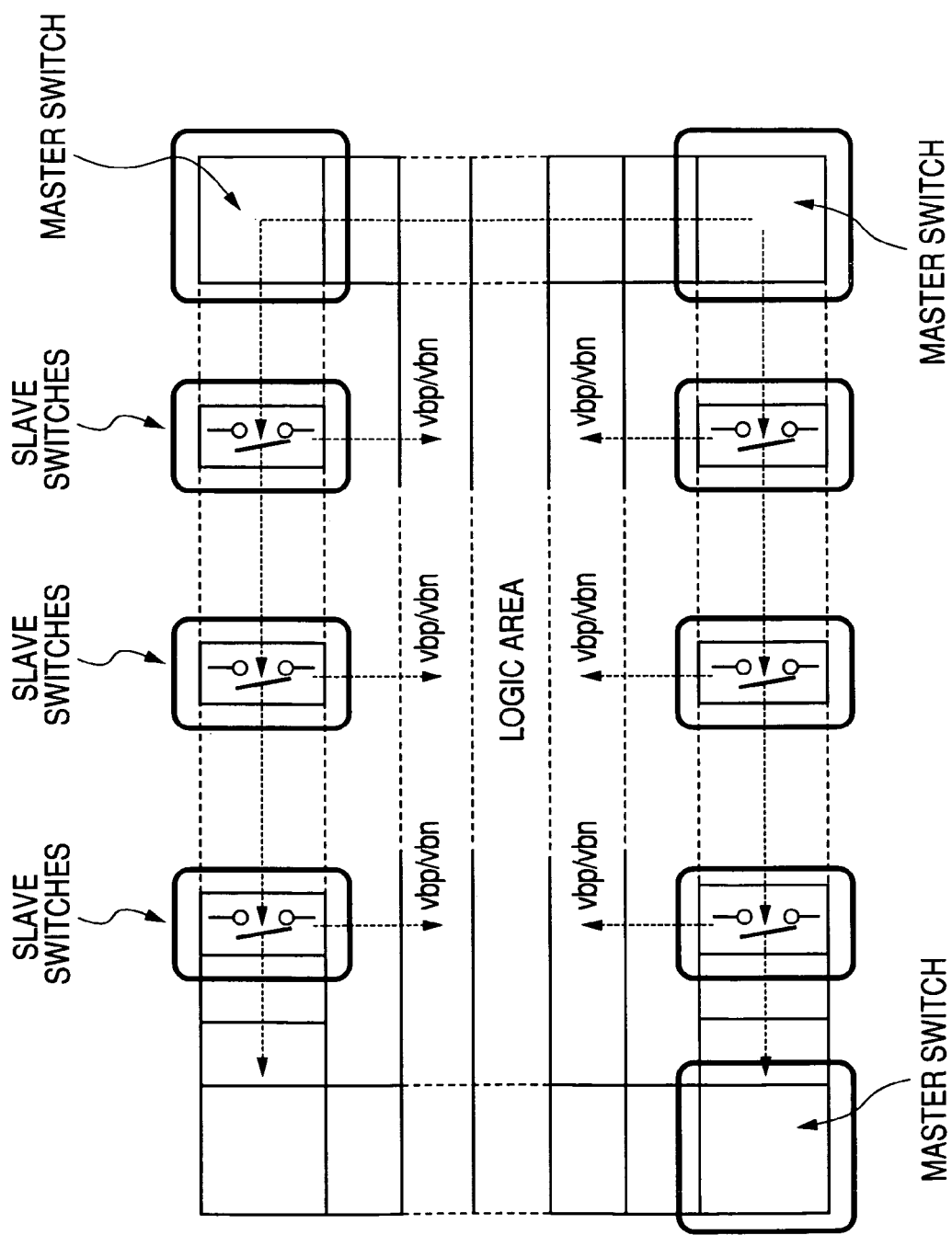
FIG. 6 is a schematic layout diagram showing an example of a part below the power supply lines for the vdd supplied logic area 1 in FIG. 1.

FIG. 6 is a schematic layout diagram showing an example of the part below the power supply lines for the vdd supplied logic circuit 1 in FIG. 1. In the example, the relation between the cells B and A is mainly illustratively shown. For the cell B, two switches are provided. Two switches are used as a set. One end of one of the switches is connected to the power supply voltage vddi provided above and the other end is connected to the bias voltage line vbp connected to an N-type well formed in the logic area. One end of the other switch is connected to the ground line vssi provided above and the other end is connected to the bias voltage line vbn connected to the P-type well formed in the logic area. In place of the configuration, two switches may be formed as in the cell C and the switches may be connected to the bias voltage lines vbp and vbn by using the two cells B.

Slave switches provided for the cells B selectively supply the bias voltage vddi or vssi at the time of normal operation to the N-type well in which the P-channel MOSFET in a CMOS circuit is to be formed and the P-type well in which the N-channel MOSFET is to be formed. As described above, the P-type wells and the N-type wells are alternately disposed in the lateral direction, so that bias voltage lines vbp and vbn extending through the switches are connected to the power supply lines of the cells E shown in FIG. 2, extend in the vertical direction, and supply the bias voltage to the P-type well and the N-type well. For the three cells A shown in the diagram, master switches and control circuits are provided.

Figure 7:
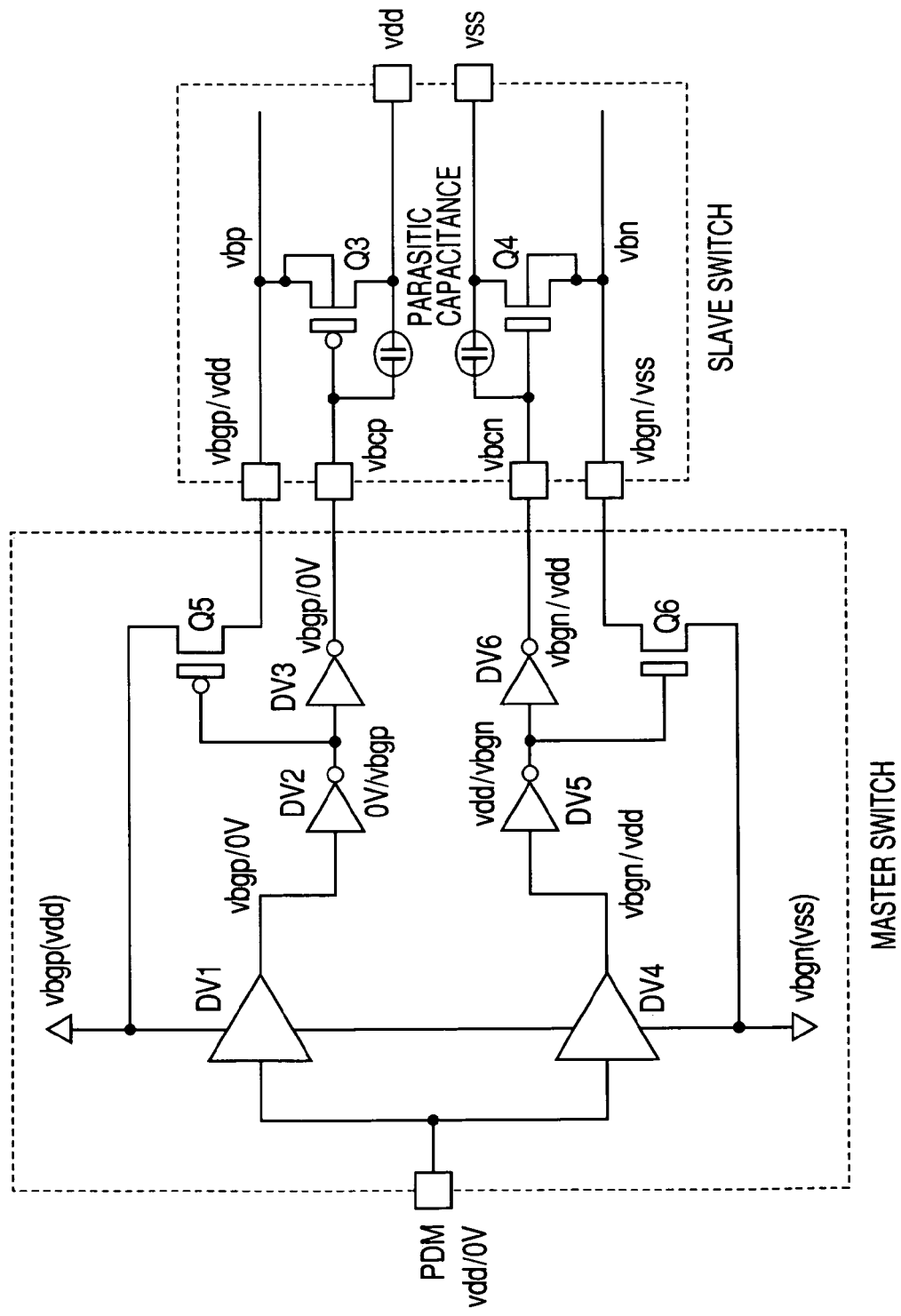
FIG. 7 is a circuit diagram showing an example of a master switch, a control circuit, and a slave switch provided for a cell A in FIG. 2.

FIG. 7 is a circuit diagram showing an example of a master switch provided for the cell A, a control circuit, and the slave switch. The master switch includes: a P-channel MOSFET Q5 which does not interrupt power supply to the CMOS circuit in the logic area when the logic circuit does not perform any operation unlike the cell C but supplies a back bias voltage vbgp (vddi+Δv) boosted to be higher than the power supply voltage vddi to the bias voltage line vbp coupled to the N-type well in a low power consumption operation while maintaining the operation of the CMOS circuit; and an N-channel MOSFET Q6 for supplying a back bias voltage vbgn (vss−Δv) lower than the ground potential vssi of the circuit to the bias voltage line vbp coupled to the P-type well. In the low power consumption operation, the P-channel MOSFET Q3 and the N-channel MOSFET Q4 constructing a slave switch provided for the cell B are turned off.

In the cell A, in addition to the MOSFETs Q5 and Q6 constructing the master switch, drive circuits DV1 to DV6 for generating control signals are provided. A power down signal PDM is transmitted via a serial circuit of the drive circuits DV1, DV2, and DV3, an output signal of the drive circuit DV2 is transmitted to the gate of the P-channel MOSFET Q5 to perform a switch control, and an output signal of the drive circuit DV3 is transmitted to the gate of the MOSFET Q3 to perform a switch control. The drive circuits DV1, DV2, and DV3 operate on a boosted voltage vbgp and the earth potential vss (0V) of the circuit and generate output signals vbgp/0V, 0V/vbgp, and vbgp/0V, respectively, by which the P-channel MOSFETs Q5 and Q3 can be on/off controlled in a complementary manner so as to switch between the boosted voltages vbgp and vdd in accordance with the power down signal PDM.

The power down signal PDM is transmitted also via another serial circuit of the drive circuits DV4, DV5, and DV6, an output signal of the drive circuit DV5 is transmitted to the gate of the N-channel MOSFET Q6 to perform a switch control, and an output signal of the drive circuit DV6 is transmitted to the gate of the MOSFET Q4 to perform a switch control. The drive circuits DV4, DV5, and DV6 operate on the power source voltage vdd and a negative voltage vbgn (−ΔV) and generate output signals vbgn/vdd, vdd/vbgn, and vbgn/vdd, respectively, by which the N-channel MOSFETs Q6 and Q4 can be on/off controlled in a complementary manner so as to switch between the negative voltage vbgn and the earth potential vss of the circuit in accordance with the power down signal PDM.

When the power down signal PDM is at the low level (0V), as described above, the drive circuit DV1 outputs 0V and the drive circuit DV4 outputs vdd. Therefore, output signals of the drive circuits DV2 and DV5 turn off the MOSFETs Q5 and Q6 as the master switches, and output signals of the drive circuits DV3 and DV6 turn on the MOSFETs Q3 and Q4 as slave switches to supply a bias voltage such as vdd to the N-type well in which the P-channel MOSFET is to be formed in the logic area and to supply the bias voltage such as vss in the P-type well in which an N-channel MOSFET is to be formed. By the operation, the threshold voltage of the P-channel MOSFET and the N-channel MOSFET in the logic area are decreased and high-speed operation is performed.

When the power down signal PDM is at the high level (vdd), as described above, the drive circuit DV1 outputs vbgp and the drive circuit DV4 outputs vbgn. Therefore, output signals of the drive circuits DV2 and DV5 turn on the MOSFETs Q5 and Q6 as the master switches, and output signals of the drive circuits DV3 and DV6 turn off the MOSFETs Q3 and Q4 as slave switches to supply a bias voltage such as vbgp to the N-type well in which the P-channel MOSFET is to be formed in the logic area and to supply the bias voltage such as vbgn to the P-type well in which an N-channel MOSFET is to be formed. By the operation, the threshold voltages of the P-channel MOSFET and the N-channel MOSFET in the logic area are increased and leak (sub threshold leak) of passage of the current to the P-channel MOSFET or the N-cannel MOSFET which are in the off state is regulated.

Figure 8:
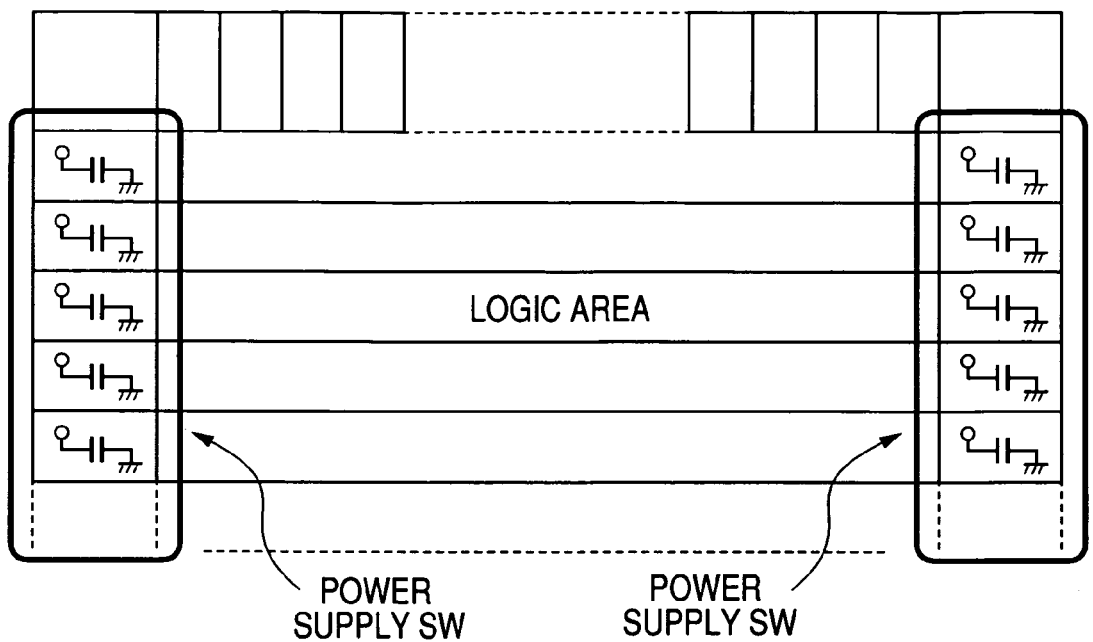
FIG. 8 is a schematic layout diagram showing another example of the part below the power supply lines for the vdd supplied logic area 1 in FIG. 1.
Figure 9:
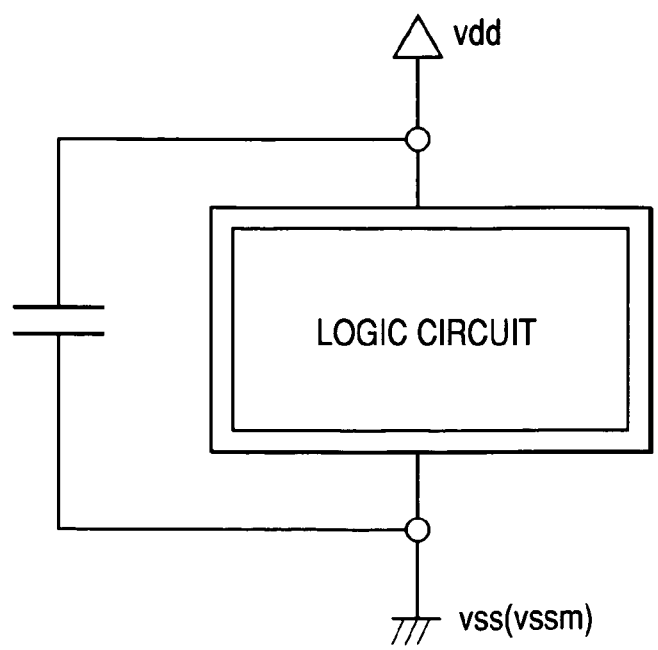
FIG. 9 is an equivalent circuit diagram corresponding to FIG. 8.

FIG. 8 is a schematic layout diagram showing another example of the part below the power supply lines for the vdd supplied logic area 1 in FIG. 1. The example is a modification of FIG. 3 and the cells C are mainly illustrated. The cells C each provided with the switch and the cells C each provided with a capacitive element shown as representatives in FIG. 8 are disposed so as to be properly scattered. The capacitor is provided between the power supply voltage line of the logic area and a ground voltage supply line of the circuit as shown in the equivalent circuit diagram of FIG. 9 to thereby perform a power supply stabilizing operation. As described above, the switch is provided for the cell C in correspondence with the ground voltage supply line vssm of the circuit in the logic area, so that the cell C in which the switch is assembled is disposed in correspondence with the ground voltage supply line vssm and the cells C in each of which the capacitive element is assembled are disposed for the rest. In such a manner, the device formation area below the power supply lines extending in the vertical direction of the logic area can be effectively used.

Figure 10:
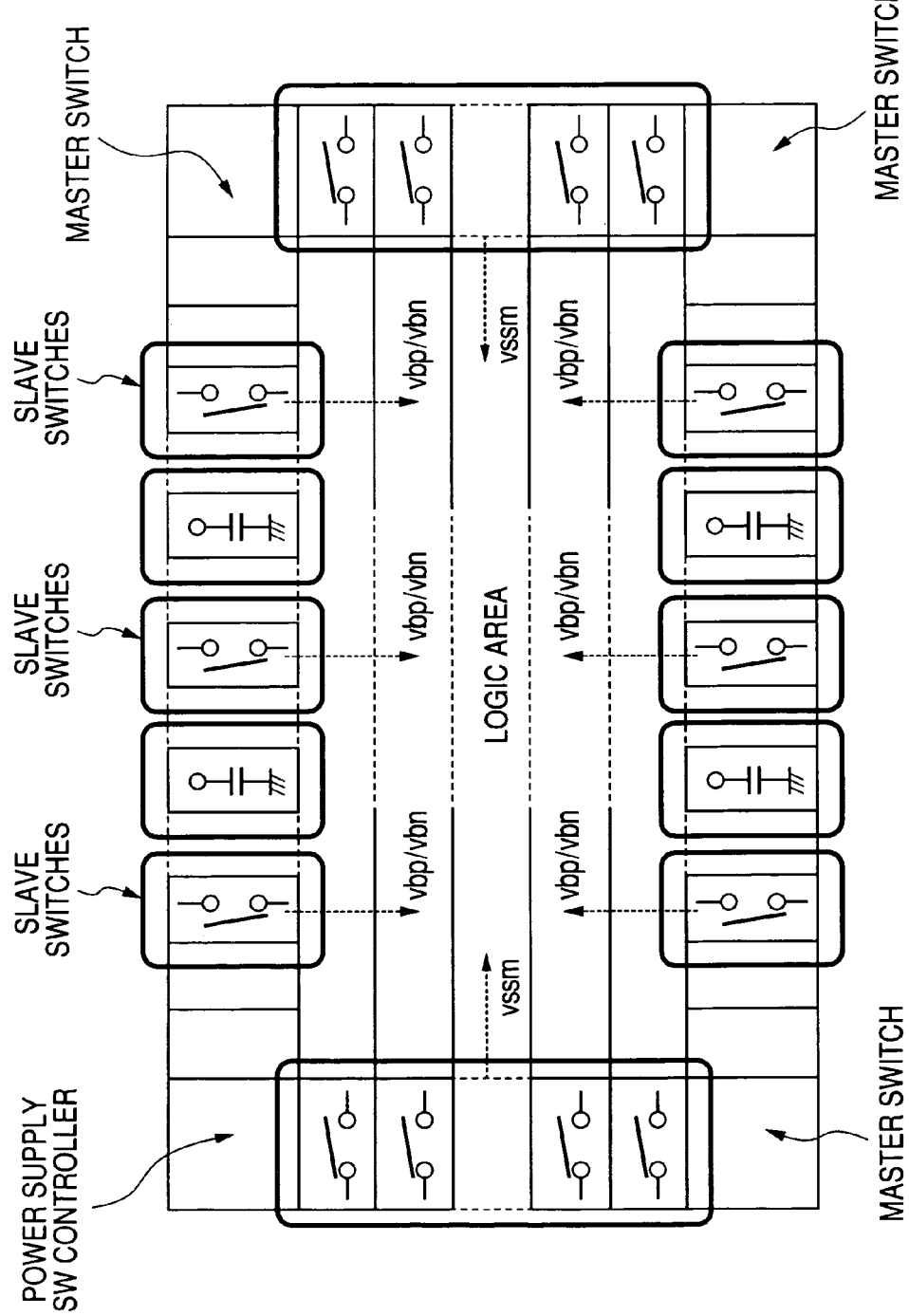
FIG. 10 is a schematic layout diagram showing another example of the part below the power supply lines for the vdd supplied logic area 1 in FIG. 1.

FIG. 10 is a schematic layout diagram showing another example of the part below the power supply lines corresponding to the vdd supplied logic area 1 in FIG. 1. The example is a modification of FIG. 6 and the cells B are mainly illustrated. The cells B each provided with the switch and the cells B each provided with a capacitive element as shown in FIG. 10 are disposed so as to be properly scattered. The capacitor is provided between the power supply voltage line of the logic area and a ground voltage supply line of the circuit as shown in the equivalent circuit diagram of FIG. 9 to thereby perform a power supply stabilizing operation. As described above, the switch is provided for the cell B in correspondence with the substrate bias lines vbp and vbn in the logic area, so that the cell B in which the switch is assembled is disposed in correspondence with the substrate bias lines vbp and vbn and the cells B in each of which the capacitive element is assembled are disposed for the rest. In such a manner, the device formation area below the power supply lines extending in the lateral direction of the logic area can be effectively used. Although not shown in FIG. 10, like FIG. 8, the cells C disposed in the vertical direction are also provided with the switches and capacitive elements.

Figure 11:
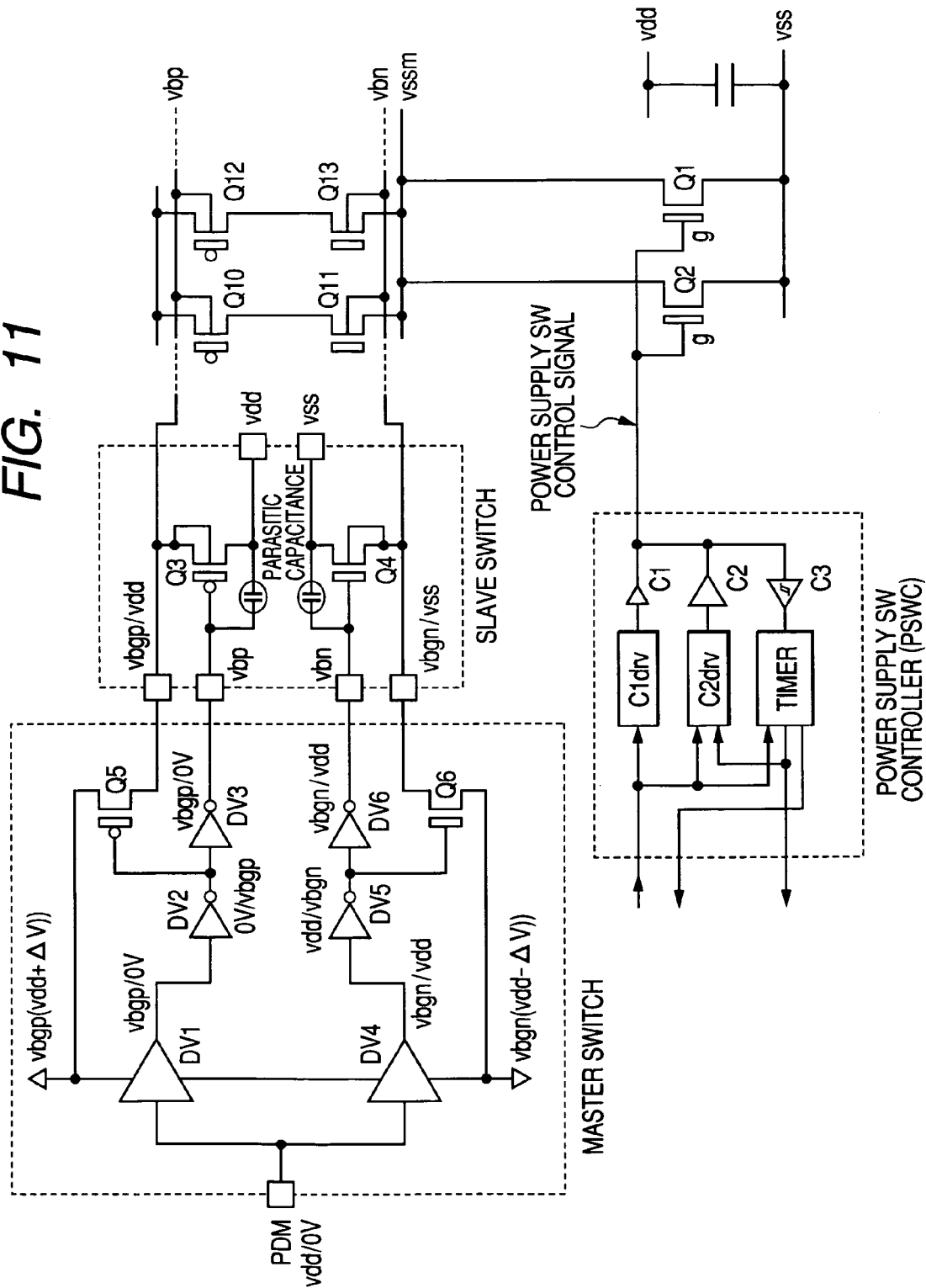
FIG. 11 is a circuit diagram showing an example corresponding to the example of FIG. 10.

FIG. 11 is a circuit diagram showing an example corresponding to the example of FIG. 10. The circuit diagram of the example shows the relations between a switch which interrupts the power source of the logic circuit and the control circuit for the switch as shown in FIG. 4, a switch for switching the substrate bias voltages applied to the logic circuit and the control circuit for the switch as shown in FIG. 7, and the relations of the logic circuit. The internal logic of the example performs two kinds of operations; an operation of realizing low consumption power by turning off the power when the logic circuit does not perform any operation as described with reference to FIG. 4, and an operation of realizing low consumption power by reducing leak current while maintaining the operation of the CMOS circuit as described with reference to FIG. 7.

The operation of realizing low consumption power by reducing leak current while maintaining the operation of the CMOS circuit as described with reference to FIG. 7 is effective in the case where the logic circuit has a storage circuit such as a register. On the other hand, the operation of realizing low consumption power by turning off the power when the logic circuit does not perform any operation as described with reference to FIG. 4 is effective in the case of a logic circuit which does not require maintaining the state before the power supply is interrupted. However, also in the case of the logic circuit which does not require to maintain the state before the power supply is interrupted, it is effective for the following case to provide the master switch and the slave switch, provide the substrate bias voltage applied to the internal logic, and switch the substrate bias voltage to be applied to the logic circuit, thereby reducing the leak current of an MOSFET.

In the semiconductor integrated circuit device, there is a test item of conducting a test of the direct current by turning on the power supply. In the test item, for example, a short circuit between the power supply line and the ground voltage supply line which are wired complicatedly in the logic circuit can be detected. However, as the device becomes finer and the threshold voltage becomes lower, a leak current flowing in an MOSFET in an off state increases. In the semiconductor integrated circuit device in which a number of devices are formed like a system LSI, the leak current is large and it is difficult to detect an erroneous direct current flowing due to a short circuit between the power supply line and the ground voltage supply line or the like.

For the direct current test, an operation mode of switching the substrate bias voltage applied to the logic circuit to reduce the leak current of the MOSFET can be effectively used. Specifically, by supplying a substrate back bias which makes the threshold voltage of the MOSFET increase to the substrate as described above, the leak current can be largely reduced, so that detection of an erroneous direct current which flows due to a short circuit between the power supply line and the ground voltage supply line is facilitated. Since the CMOS circuit is operating, by operating the logic circuit at a low operation frequency, an erroneous direct current between a signal transmission path and the power supply line or the ground voltage supply line can be also detected.

Although the cells A to C have been described by using the vdd supplied logic area 1 shown in FIG. 1 as an example, they can be similarly applied as the cells A to C of the vdd supplied logic area 2 shown in FIG. 2. In the case where part of the quadrate of the logic area is missing like the example of FIG. 2, six cells A are provided. Consequently, in the example of FIG. 2, two or three cells an each having the power supply SW controller as shown in the example of FIG. 4 may be provided.

Figure 12:
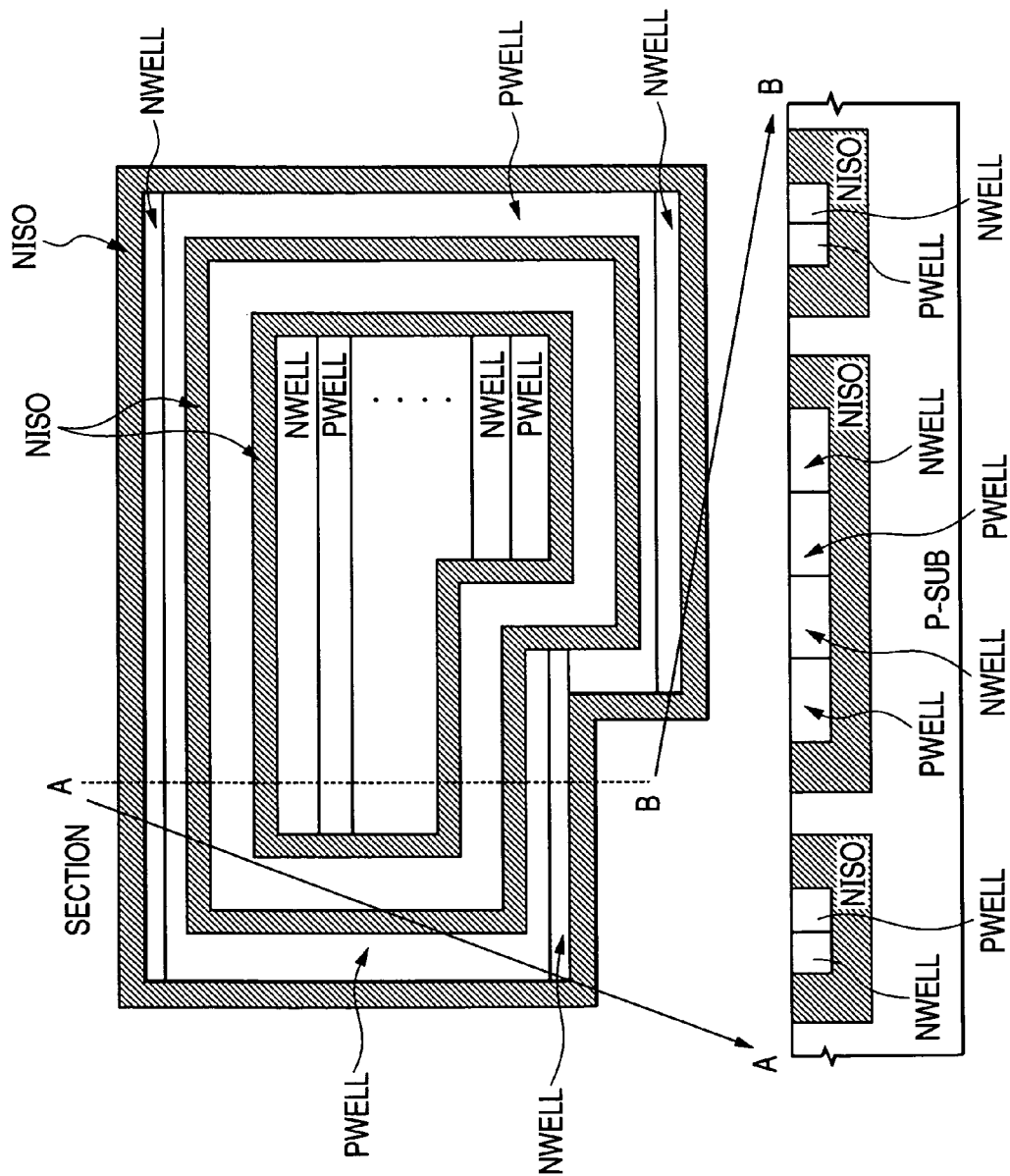
FIG. 12 is a schematic configuration diagram showing an example of a well region corresponding to the vdd supplied logic area 2 in FIG. 2.

FIG. 12 is a schematic configuration diagram showing an example of a well region corresponding to the vdd supplied logic area 2 in FIG. 2. In FIG. 12, the layout is shown in the upper part and corresponding sectional structures are shown in the lower part. In the part below the power supply lines corresponding to the vdd supplied logic area 2, isolation regions NISO constructed by deep well regions for electrically isolating the device formation region (well region) in which the switch MOSFET and capacitors are formed from the semiconductor substrate are provided. For example, when the semiconductor substrate is of the P type (P-sub), the isolation region NISO is of the N type. In the isolation region NISO, an N-type well region for forming a P-channel MOSFET and a P-type well region for forming an N-channel MOSFET are formed.

Since the N-channel MOSFETs Q1, Q2, and so on are provided like the power switch of FIG. 11 along the power supply line extending in the vertical direction of the vdd supplied logic area 2, the P-type well region is provided. In contrast, since the P-channel MOSFET Q3 and the N-channel MOSFET Q4 are provided like the slave switches in FIG. 11 along the power supply line extending in the lateral direction, although not limited, an N-type well region and a P-type well region formed so as to extend in the lateral direction are provided. Also in the logic area, N-type well regions and P-type well regions extending in the lateral direction are alternately disposed so as to form a CMOS circuit. At each of the corners of the vdd supplied logic area 2, the N-type well region and the P-type well region provided along the power supply lines extending in the lateral direction extend, and a P-channel MOSFET and an N-channel MOSFET constructing the cell A are formed.

Figure 13:
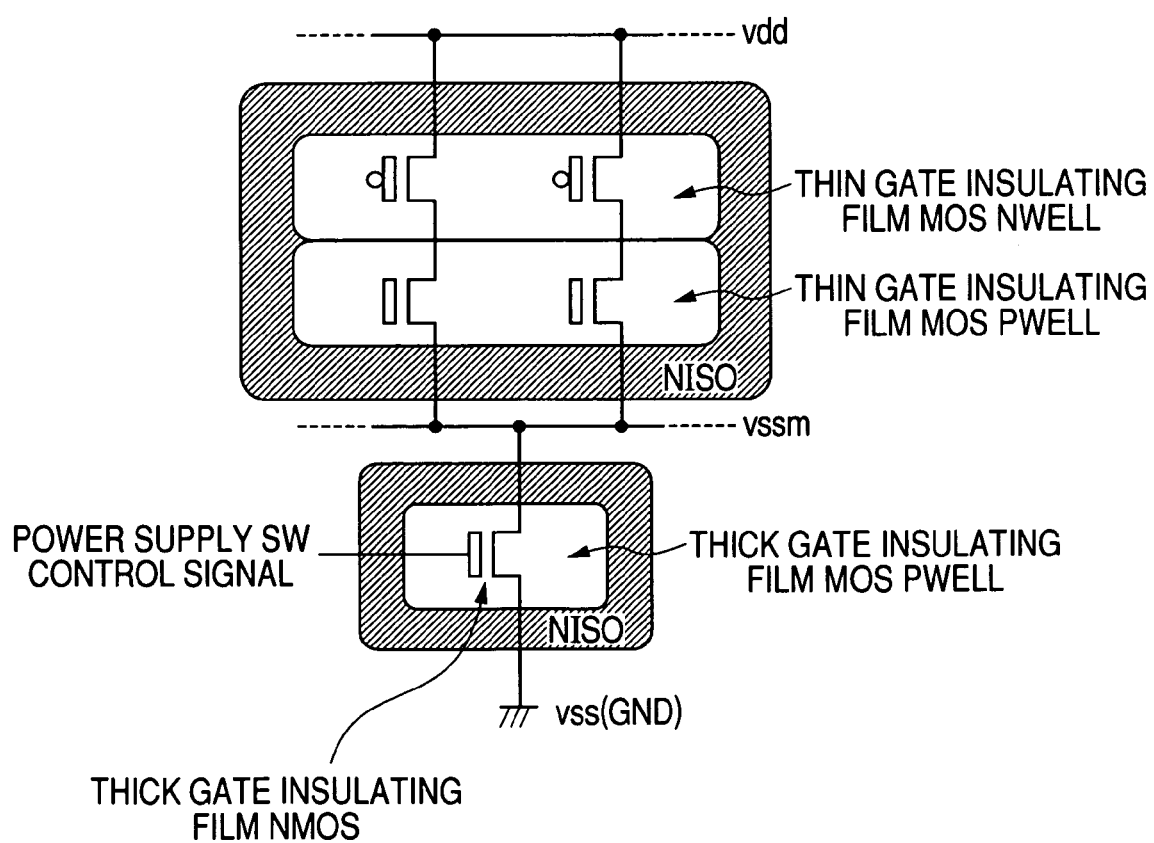
FIG. 13 is a circuit diagram showing the relations among the logic area in FIG. 12, an MOSFET in a power switch part, and the well region.

FIG. 13 is a circuit diagram for explaining the relations among the logic area, the MOSFETs of the power switch part, and the well region. The P-channel MOSFETs in the logic area are formed in the N-type well NWELL and operate on the low power supply voltage vdd, so that they are formed by the thin film MOS. The thin film MOS denotes that a gate insulating film which is formed thinly and has a low withstand voltage (low threshold voltage). The N-channel MOSFETs in the logic area are formed in the P-type well PWELL and operate on the low power supply voltage vdd, so that they are formed by the thin film MOS. In contrast, the power switch MOSFET Q1 is formed in the P-type well region PWELL extending in the vertical direction and is formed by a thick film MOS in order to reduce the leak current. The thick film MOS denotes a gate insulating film which is formed thickly and has a high threshold voltage (high withstand voltage). With the configuration, the leak current flowing between the drain and source when the MOSFET Q1 is in the off state is reduced and lower power consumption can be achieved.

Figure 14:
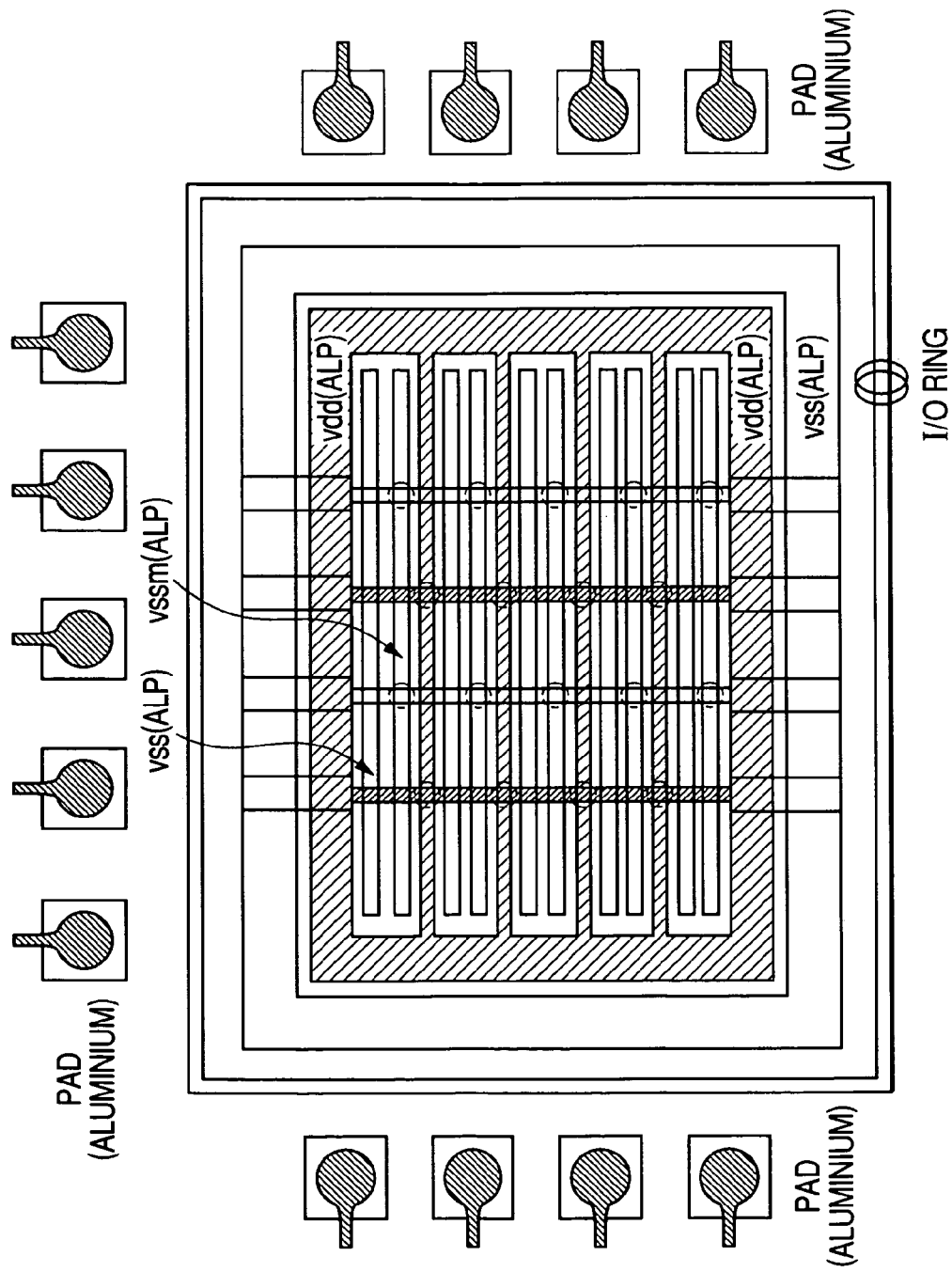
FIG. 14 is a schematic layout diagram showing an example of the power supply lines of the semiconductor integrated circuit device according to the invention.

FIG. 14 is a schematic layout diagram showing an example of power supply lines of the semiconductor integrated circuit device according to the invention. The diagram shows the relations between bonding pads PAD provided along the periphery of the semiconductor chip and the power supply lines formed in the semiconductor integrated circuit device. The bonding pad PAD is constructed by a relatively thick aluminium layer for bonding a metal wire as shown in the diagram. Between a line of the bonding pads and the circuit formation area on the inside, the power supply voltage line vdd and the ground voltage supply line vss of the circuit are arranged together with an I/O ring. In the example, the power supply voltage line vdd and the ground voltage supply line vss are formed by using the relatively thick aluminium layer ALP formed by the same manufacturing process as the bonding pads PAD.

As the power supply voltage line vdd has a plurality of power supply lines extended in the lateral direction so as to cross the logic area by using the relatively thick aluminium layer ALP. In the vertical direction, the power supply lines made by a copper layer formed in an underlayer of the aluminium layer extend. The power supply lines in the lateral and vertical directions are connected to each other at crossing points in a mesh state on the logic area. The ground voltage supply lines vssm extend in the lateral direction in the logic area and are constructed by the relatively thick aluminium layer in a manner similar to the above. Both ends of the ground voltage supply line vssm are connected to the power switch MOSFETs Q1. In the diagram, the connection part is not shown. The ground voltage supply lines cross power supply lines made by the copper layer formed in the underlayer extend in the vertical direction, and the ground voltage supply lines and the power supply lines are connected to each other at the crossing points in a mesh state over the logic area. Below the power supply lines vdd and vss formed so as to surround the logic area, the power supply SW controller for controlling power supply, a power switch, a slave switch, a main switch and their control circuits as shown in FIG. 11 are provided as necessary. The power supply line vss provided in parallel with the ground voltage supply line in the logic area is used for supplying power to the P-type well. It is also possible to omit the power supply line vss and connect the well and the source of the N-channel MOSFET to the ground voltage supply line vssm.

Figure 15:
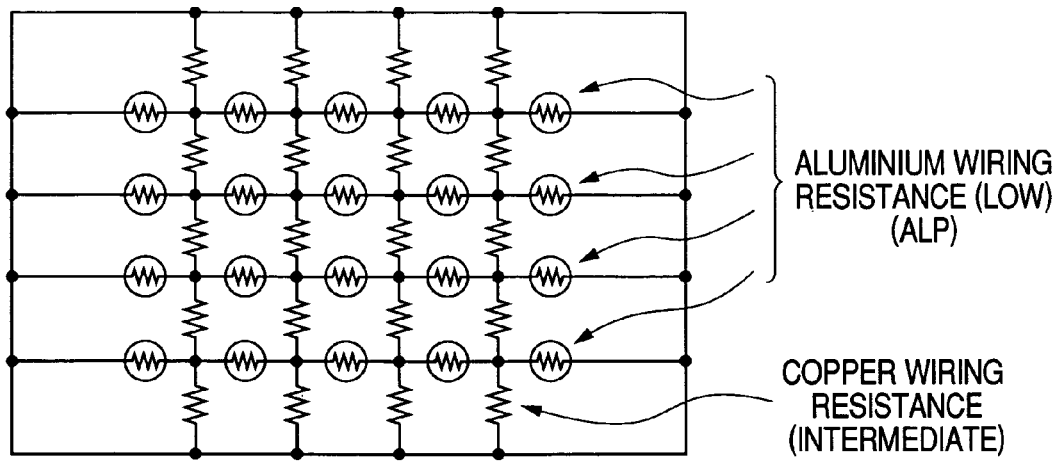
FIG. 15 is an equivalent circuit diagram of the power supply lines of FIG. 14.

FIG. 15 is an equivalent circuit diagram of the power supply line of FIG. 14. In FIG. 15, the power supply voltage vdd is shown as an example. Since the power supply line extending in the lateral direction among the power supply lines in a mesh shape is formed by using the relatively thick aluminium layer (ALP), the resistance value of distributed resistances circled in the diagram can be decreased. In contrast, the power supply lines extending in the vertical direction are formed by the thin copper layer, so that the resistance value of distributed resistances is larger than that in the thick aluminium layer. That is, as compared with the case where the power supply line is formed by a copper layer like the conventional technique, the resistance value of the distributed resistances in the power supply line extended in the lateral direction is smaller. Thus, variations in the power supply caused by the current flowing during the operation of the logic circuit can be suppressed.

From another viewpoint, the number of wiring layers necessary for the logic circuit can be decreased by one. Specifically, in the case of forming the power supply lines vdd in a mesh shape, by using the relatively thick aluminium layer formed by the same manufacturing process as that of the bonding pads, the copper wiring of one layer can be omitted and the manufacturing process can be simplified.

Figure 16:
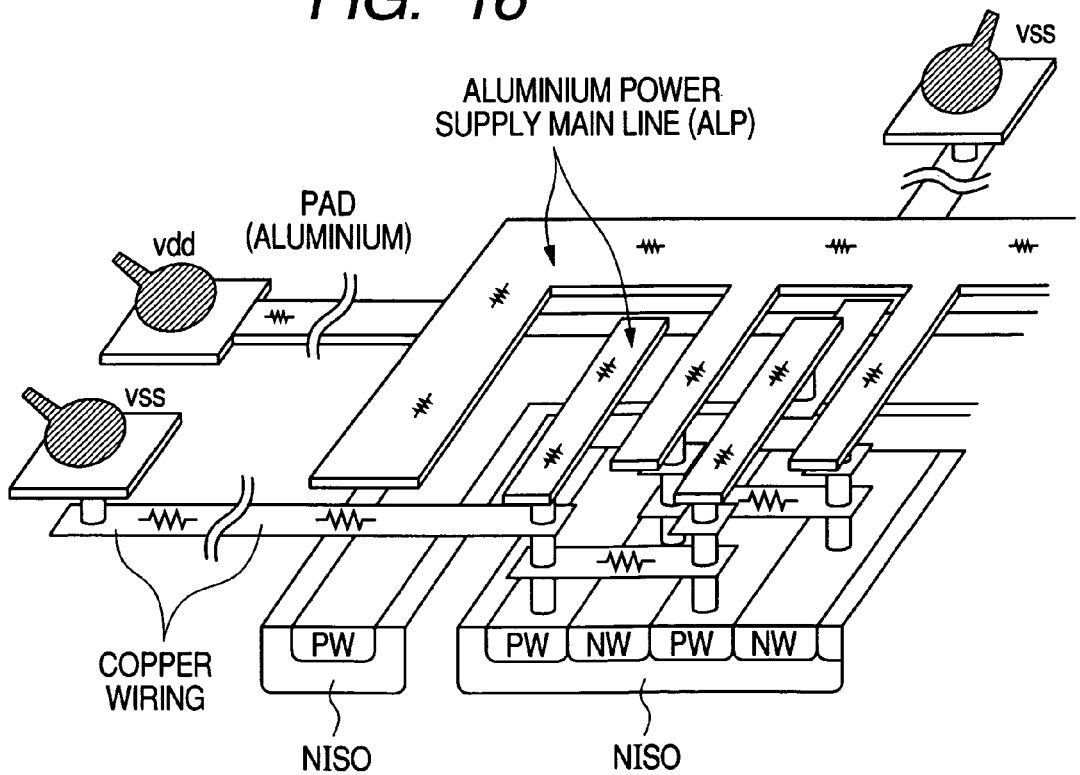
FIG. 16 is a schematic structure perspective view showing an example of the power supply lines in the semiconductor integrated circuit device according to the invention.

FIG. 16 is a schematic structure perspective view showing an example of the power supply lines in the semiconductor integrated circuit device according to the invention. The diagram shows the relations of bonding pads (AL pads) for supplying power and internal power lines and the like connected to the bonding pads in a stereoscopic manner. The insulating films between the wiring layers are omitted and contact parts with the wiring layers are illustrated. The bonding pads made by the relatively thick aluminium layer are connected to wires made by the lower copper layer via the contact parts and extend to the inner circuit. The configuration is to avoid the power supply lines in the input circuit and along the periphery like in the semiconductor integrated circuit device shown in FIG. 1.

The power supply main lines ALP corresponding to the logic area are formed by the relatively thick aluminium layer formed by the same manufacturing process as the bonding pads and are connected by contacts via the copper layer extending toward the internal circuits. In the diagram, as the power supply main line, the power supply voltage line vdd is illustrated. The power supply main line (ALP) is connected to, for example, the N-type well region NW in which the P-channel MOSFET is to be formed via the wiring or contacts made by the copper layer as the under layer. The bonding pad vss for grounding is also connected to the wiring made by the copper layer as the under layer via the contact part and extends to the inner circuit. The bonding pad vss is connected to the power supply main line for grounding made by the relatively thick aluminium layer and is also connected to the P-type well region PW in which, for example, an N-channel MOSFET is to be formed via a similar wiring or contact made by a copper layer as an under layer. The power supply main lines may be constructed in the mesh shape by the power supply wirings made by the copper layer form as the under layer.

Figure 17:
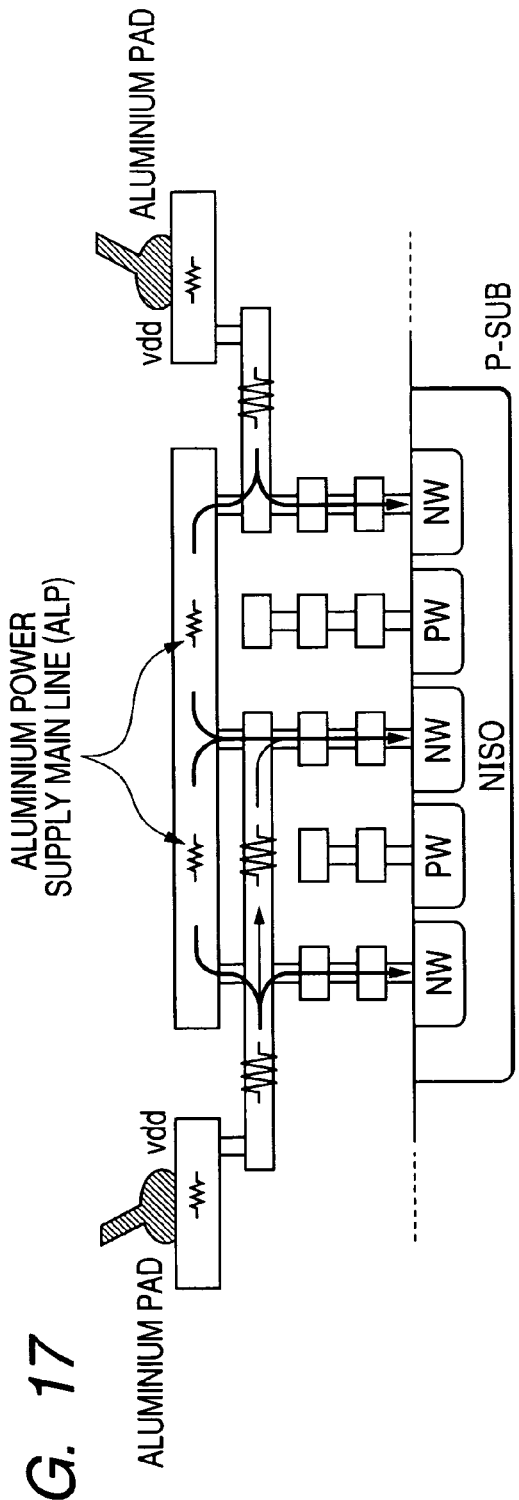
FIG. 17 is a schematic structure cross section showing an example of power supply voltage lines in the semiconductor integrated circuit device according to the invention.

FIG. 17 is a schematic structure cross section showing an example of the power supply voltage line in the semiconductor integrated circuit device according to the invention. The diagram illustrates the path for supplying the power supply voltage vdd as a representative. As described in FIG. 16, the bonding pad formed by the thick aluminium layer or the like is connected to the wiring layer made of copper as the under layer, whose one end is connected to the power supply main line ALP made of aluminium or the like formed as an upper layer via the contact and the other end is connected to the N-type well region NW in which a P-channel MOSFET is to be formed via the wiring layer as the under layer and the contact. In the configuration, the wiring constructed by the copper layer as the lower layer and the power supply main line made by the aluminium layer as the upper layer are provided in parallel with each other. With the configuration, the current necessary for the operation of the logic circuit flows so s to be split to the two power supply paths and flows into the main line side more. Thus, the impedance of the power supply line can be suppressed. Consequently, variations and fluctuations in the power supply voltages in the logical circuits while the logic circuit is operating can be suppressed. When the logic circuit operates on a low voltage such as 1.2V (or lower), variations and fluctuations in the power supply voltage exert a large influence on the circuit operation. Consequently, by the example, stable operation of the logic circuit is expected.

Figure 18:
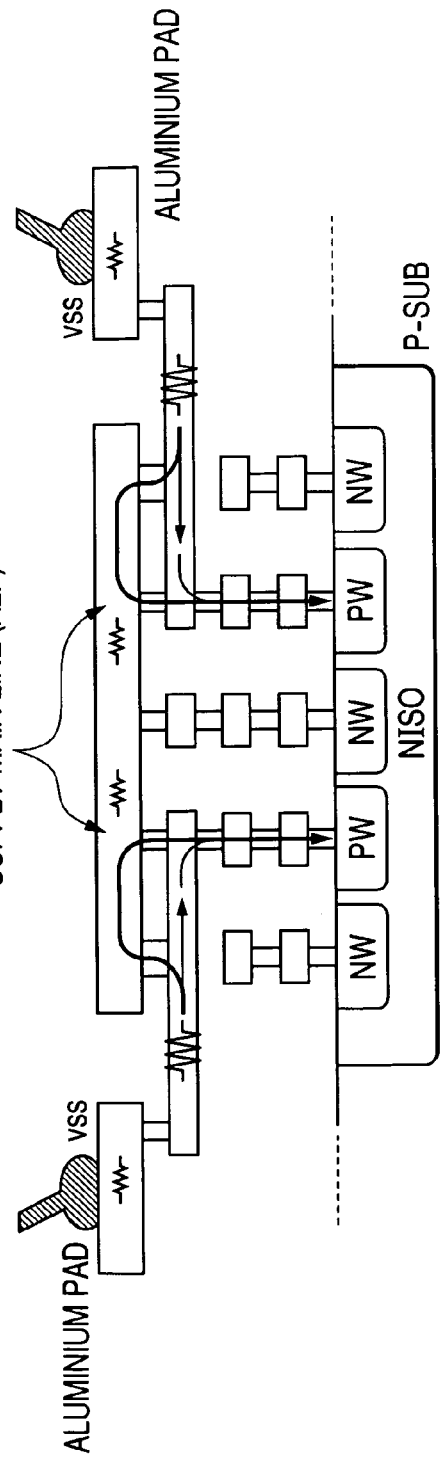
FIG. 18 is a schematic structure cross section showing another example of power supply voltage lines in the semiconductor integrated circuit device according to the invention.

FIG. 18 is a schematic structural cross section showing another example of the power supply voltage lines in the semiconductor integrated circuit device according to the invention. In the diagram, paths of supplying the earth potential vss are illustrated as a representative. Like FIG. 17, also in the ground voltage supply line vss, the bonding pad made by a thick aluminium layer is connected to the wiring layer formed by the copper layer as a lower layer, connected to the power supply main line ALP made of aluminium and formed as an upper layer via a contact, and connected to the P-type well region PW in which an N-channel MOSFET is to be formed via the wiring layers provided as the lower layer and contacts. With the configuration, the impedance of the ground voltage supply line can be suppressed in a manner similar to the above. Consequently, variations and fluctuations in the earth potentials in the logical circuits while the logic circuit is operating can be suppressed. When the logic circuit operates on a low voltage such as 1.2V (or lower), variations and fluctuations in the earth potential exert a large influence on the circuit operation. Therefore, by the example, stable operation of the logic circuit is expected.

Although the invention achieved by the inventors herein has been concretely described on the basis of the embodiments, the invention is not limited to the foregoing embodiments but can be variously changed without departing from the gist. For example, a configuration may be employed such that only master switches and slave switches are provided as shown in FIG. 7 for all of circuits of the semiconductor integrated circuit device and, only at the time of the direct current test, the voltage is switched to the back bias voltage for increasing the threshold voltage in all of P-channel MOSFETs and N-channel MOSFETs. In this case as well, master switches and slave switches as described above are provided below the power supply lines provided along the periphery of the chip. Since the power switch is unnecessary, an oscillation circuit, a charge pump circuit, and a control circuit for generating back bias voltages vbp and vbn may be provided in the portion. The invention can be widely used for the semiconductor integrated circuit devices such as a microcomputer and a system LSI.

What is claimed is:

1. A semiconductor integrated circuit device comprising:
 a plurality of internal circuits;
 a first cell including a first pair of power supply lines constructed by a power supply voltage line and a ground voltage supply line of the circuit which extend in parallel in a first direction, and a first switch elements disposed in a lower layer including a semiconductor substrate of the first pair of power supply line and provided between said power supply voltage line and said ground voltage supply line of the circuit and a corresponding power supply line of said internal circuit;
 a second cell including a pair of second power supply lines constructed by a power supply voltage line and an ground voltage supply line of the circuit which extend in parallel in a second direction orthogonal to said first direction, and either a second switch element or a third switch element, the second switch element being disposed in a lower layer including the semiconductor substrate of the pair of second power supply lines and provided between a first bias line connected to a first well region in which a MOSFET of a first conduction type of said internal circuit is to be formed and a first back bias line, and the third switch element being provided between a second bias line connected to a second well region in which a MOSFET of a second conduction type is to be formed and a second back bias line; and
 a third cell positioned at an outside of a corner of a device region in which said internal circuit is to be formed, and having a plurality of kinds of elements including a corner power supply line connecting said first and second pair of power supply lines, the power supply voltage line, and the ground voltage supply line, a power supply switch controller disposed in a lower layer including a semiconductor substrate of the corner power supply line and is controlling the first switch element of said first cell, fourth and fifth switch elements for connecting said corresponding power supply voltage line and the ground voltage supply line of the circuit to said first and second bias lines, and a control circuit for controlling switch between said fourth and fifth switch elements and said second and third switch elements,
 wherein a plurality of said first, second, and third cells are provided in accordance with the size of said internal circuit so as to surround said internal circuit and so that the corresponding power supply lines are connected to each other.

2. The semiconductor integrated circuit device according to claim 1, further comprising:
 a fourth cell including said first pair of power supply lines and a capacitive element disposed in a lower layer including the semiconductor substrate of the first pair of power supply lines and provided in said power supply voltage line and the ground voltage supply line of the circuit, corresponding to said first direction; and
 a fifth cell including the pair of second power supply lines and a capacitive element disposed in a lower layer including the semiconductor substrate of the pair of second power supply lines and provided in said power supply voltage line and the ground voltage supply line of the circuit, corresponding to said second direction,
 wherein said fourth cell is disposed so as to be aligned with said first cell, and
 wherein said fifth cell is disposed so as to be aligned with said second cell.

3. The semiconductor integrated circuit device according to claim 2, further comprising:
 a sixth cell provided with a power switch controller for controlling the first switch element of said first cell in correspondence with one of said corner power supply lines; and
 a seventh cell in which the fourth and fifth switch elements for connecting said first and second bias lines to said corresponding power supply voltage line and the ground voltage supply line of the circuit in correspondence with the other remaining corner power supply lines, and a control circuit for controlling between the fourth and fifth switch elements and the second and third switch elements are distributed.

4. The semiconductor integrated circuit device according to claim 3, further comprising:

an eighth cell having said first pair of power supply lines whose length in the first direction is shorter than said first cell in said first direction, wherein said eighth cell is disposed so as to be aligned with said first and fourth cells.

5. The semiconductor integrated circuit device according to claim 4, wherein a plurality of first wiring layers extending in said first direction are disposed below said first pair of power supply lines in said first, fourth, and eighth cells aligned in said first direction, and wherein said first wiring layers include a first wiring layer used for transmitting control signals for switching control of said first switch element.

6. The semiconductor integrated circuit device according to claim 3, wherein a plurality of second wiring layers extending in said second direction are disposed below said pair of second power supply lines in said second and fifth cells aligned in said second direction, and wherein said second wiring layers include a second wiring layer used for transmitting control signals for switching control of said second and third switch elements.

7. The semiconductor integrated circuit device according to claim 4, further comprising a ninth cell having a first pair of power supply lines constructed by a power supply voltage line and the ground voltage supply line of the circuit extending in parallel with each other in said first direction, wherein, over a semiconductor region in which said internal circuit is to be formed, said ninth cells are arranged in the first direction and said power supply voltage line and the ground voltage supply line of the circuit are alternately connected between said facing second or fifth cells.

* * * * *